(12) United States Patent
Shiragami

(10) Patent No.: US 10,600,954 B2
(45) Date of Patent: Mar. 24, 2020

(54) METHOD FOR PRODUCING HERMETIC PACKAGE

(71) Applicant: Nippon Electric Glass Co., Ltd., Shiga (JP)

(72) Inventor: Toru Shiragami, Shiga (JP)

(73) Assignee: NIPPON ELECTRIC GLASS CO., LTD., Shiga (JP)

(*) Notice: Subject to any disclaimer, the term of this patent is extended or adjusted under 35 U.S.C. 154(b) by 124 days.

(21) Appl. No.: 15/552,535

(22) PCT Filed: Feb. 25, 2016

(86) PCT No.: PCT/JP2016/055675
§ 371 (c)(1),
(2) Date: Aug. 22, 2017

(87) PCT Pub. No.: WO2016/136899
PCT Pub. Date: Sep. 1, 2016

(65) Prior Publication Data
US 2018/0033951 A1 Feb. 1, 2018

(30) Foreign Application Priority Data
Feb. 26, 2015 (JP) ................................ 2015-036344

(51) Int. Cl.
*H01L 41/23* (2013.01)
*H01L 23/10* (2006.01)
(Continued)

(52) U.S. Cl.
CPC .............. *H01L 41/23* (2013.01); *B32B 18/00* (2013.01); *C04B 37/045* (2013.01); *H01L 23/02* (2013.01);
(Continued)

(58) Field of Classification Search
CPC ............ B32B 18/00; C04B 2235/5436; C04B 2235/5463; C04B 2235/9607; C04B 2235/963; H01L 23/02
See application file for complete search history.

(56) References Cited

U.S. PATENT DOCUMENTS 4,769,345 A * 9/1988 Butt .................. H01L 23/04
174/50.51
4,784,974 A * 11/1988 Butt .................. H01L 21/50
156/89.18
(Continued)

FOREIGN PATENT DOCUMENTS

JP 2003-158208 5/2003
JP 2008-186697 8/2008
(Continued)

OTHER PUBLICATIONS

International Search Report dated May 17, 2016 in International Application No. PCT/JP2016/055675.
(Continued)

*Primary Examiner* — Minh N Trinh
(74) *Attorney, Agent, or Firm* — Wenderoth, Lind & Ponack, L.L.P.

(57) ABSTRACT

A technical object of the present invention is to devise a method by which bonding strength between an element base and a sealing material layer can be increased without thermal degradation of a member to be housed inside, to thereby improve long-term reliability of a hermetic package. A method of producing a hermetic package of the present invention includes the steps of: preparing a ceramic base and forming a sealing material layer on the ceramic base; preparing a glass substrate and arranging the ceramic base and the glass substrate so that the glass substrate is brought into contact with the sealing material layer on the ceramic base; and irradiating the sealing material layer with laser
(Continued)

light from a glass substrate side to seal the ceramic base and the glass substrate with each other through intermediation of the sealing material layer, to thereby provide a hermetic packages.

7 Claims, 2 Drawing Sheets

(51) Int. Cl.
    *H01L 23/02*     (2006.01)
    *H01L 23/08*     (2006.01)
    *B32B 18/00*     (2006.01)
    *H01L 41/053*    (2006.01)
    *H03H 3/02*     (2006.01)
    *C04B 37/04*     (2006.01)

(52) U.S. Cl.
    CPC .............. *H01L 23/08* (2013.01); *H01L 23/10* (2013.01); *H01L 41/053* (2013.01); *C04B 2235/5436* (2013.01); *C04B 2235/5463* (2013.01); *C04B 2235/963* (2013.01); *C04B 2235/9607* (2013.01); *C04B 2237/10* (2013.01); *C04B 2237/32* (2013.01); *C04B 2237/343* (2013.01); *C04B 2237/52* (2013.01); *C04B 2237/592* (2013.01); *C04B 2237/708* (2013.01); *H03H 3/02* (2013.01)

(56) References Cited

U.S. PATENT DOCUMENTS

| | | | | |
|---|---|---|---|---|
| 5,155,299 A | * | 10/1992 | Mahulikar | ............ H01L 23/057 174/536 |
| 5,188,985 A | * | 2/1993 | Medeiros, III | ........ H01L 23/043 257/693 |
| 5,227,583 A | * | 7/1993 | Jones | ...................... H01L 23/15 174/350 |
| 6,621,379 B1 | * | 9/2003 | Goetz | ...................... H03H 3/08 29/25.35 |
| 2018/0033951 A1 | * | 2/2018 | Shiragami | ............... H01L 23/02 |

FOREIGN PATENT DOCUMENTS

| | | |
|---|---|---|
| JP | 2013-38727 | 2/2013 |
| JP | 2015-23263 | 2/2015 |
| WO | 2012/108083 | 8/2012 |

OTHER PUBLICATIONS

International Preliminary Report on Patentability dated Aug. 29, 2017 in International Application No. PCT/JP2016/055675.

\* cited by examiner

METHOD FOR PRODUCING HERMETIC PACKAGE

TECHNICAL FIELD

The present invention relates to a method of producing a hermetic package through sealing treatment using laser light (hereinafter referred to as "laser sealing").

BACKGROUND ART

For a hermetic package, expensive investigations have been made on maintaining characteristics and prolonging a lifetime. For example, a piezoelectric vibrator element is a sensitive element that is easily degraded through exposure to oxygen and moisture in its surrounding environment. In view of this, there has been an attempt to hermetically incorporate the piezoelectric vibrator element into a piezoelectric vibrator package, to thereby maintain the characteristics of the piezoelectric vibrator package and prolong the lifetime of the package.

As a hermetic structure of the piezoelectric vibrator package, the following hermetic structure has been investigated: a hermetic structure in which a glass substrate is arranged above an element base on which a piezoelectric vibrator element is arranged so that the glass substrate is spaced apart from and faces the element base, and under such state, the space between the glass substrate and the element base is sealed with a sealing material layer so that the piezoelectric vibrator element is surrounded by the sealing material layer. Ceramic, for example, alumina is generally used as the element base.

However, it has been known that the piezoelectric vibrator element has low heat resistance. Therefore, when the element base and the glass substrate are sealed with each other through firing in a temperature range in which the sealing material layer softens and flows, there is a risk in that the characteristics of the piezoelectric vibrator element are thermally degraded.

CITATION LIST

Patent Literature 1: JP 2008-186697 A

SUMMARY OF INVENTION

Technical Problem

In recent years, laser sealing has been investigated as a method of sealing the hermetic package. The laser sealing can locally heat only the sites to be sealed, and hence the element base and the glass substrate can be sealed with each other while thermal degradation of the element having low heat resistance or the like is prevented.

Meanwhile, through the laser sealing, it is difficult to increase bonding strength between the element base and the sealing material layer. In addition, when the element base is formed of ceramic, it is more difficult to increase the bonding strength between the element base and the sealing material layer.

Specifically, the laser sealing is a method involving locally heating the sealing material layer to cause the sealing material layer to soften and flow. Therefore, a time period required for the laser sealing is shortened, and along with this, reaction time between the element base and the sealing material layer is also shortened. As a result, a reaction layer is not sufficiently generated at an interface between the element base and the sealing material layer, and the bonding strength between the element base and the sealing material layer is decreased.

The present invention has been made in view of the above-mentioned circumstances, and a technical object of the present invention is to devise a method by which bonding strength between an element base and a sealing material layer can be increased without thermal degradation of a member to be housed inside, to thereby improve long-term reliability of a hermetic package.

Solution to Problem

As a result of extensive investigations, the inventor of the present invention has found that the sealing strength of a hermetic package is increased when a sealing material layer is formed on a ceramic base in advance to increase bonding strength between the ceramic base and the sealing material layer, and then a glass substrate is arranged so as to face the ceramic base through intermediation of the sealing material layer, followed by laser sealing of the glass substrate and the sealing material layer. Thus, the finding is proposed as the present invention. That is, firstly a method of producing a hermetic package according to one embodiment of the present invention comprises the steps of: preparing a ceramic base and forming a sealing material layer on the ceramic base; preparing a glass substrate and arranging the ceramic base and the glass substrate so that the glass substrate is brought into contact with the sealing material layer on the ceramic base; and irradiating the sealing material layer with laser light from a glass substrate side to seal the ceramic base and the glass substrate with each other through intermediation of the sealing material layer, to thereby provide a hermetic package.

A sealing material generally comprises low-melting-point glass. At the time of laser sealing, the low-melting-point glass erodes a surface layer of an element base to generate a reaction layer. When the element base is formed of glass, the reaction layer is generated to some extent through the laser sealing, and thus bonding strength can foe ensured. However, when the element base is formed of ceramic, the low-melting-point glass hardly erodes the surface layer of the element base at the time of laser sealing, and the reaction layer is not generated sufficiently. That is, when the element base is formed of glass, the reaction layer can be formed through the laser sealing, but when the element base is formed of ceramic, it is difficult to form the reaction layer through the laser sealing. In view of the foregoing, in the present invention, the sealing material layer is formed on the ceramic base in advance through firing with an electric furnace or the like, and then the ceramic case and the glass substrate are sealed with each other through the laser sealing. With this, bonding strength between the ceramic base and the sealing material layer can be increased, and concurrently also bonding strength between the glass substrate and the sealing material layer can be ensured. When the sealing material layer is formed on the ceramic base in advance through firing with an electric furnace or the like, the reaction layer can be formed sufficiently on a surface layer of the ceramic base.

Secondly, in the method of producing a hermetic package according to the embodiment of the present invention, the forming a sealing material layer is preferably performed by using a ceramic base comprising a base part and a frame part formed on the base part and forming the sealing material layer on a top of the frame part. With this, a member such as a piezoelectric vibrator element is easily housed in the hermetic package.

Thirdly, in the method of producing a hermetic package according to the embodiment of the present invention, the forming a sealing material layer is preferably performed after subjecting the top of the frame part to polishing treatment.

Fourthly, in the method of producing a hermetic package according to the embodiment of the present invention, the subjecting the top of the frame part to polishing treatment is preferably performed so that the top of the frame part has a surface roughness Ra of less than 0.5 μm.

Fifthly, in the method of producing a hermetic package according to the embodiment of the present invention, the forming a sealing material layer is preferably performed by applying and firing a sealing material paste to form a sealing material layer formed of a sintered body of a sealing material on the ceramic base. With this, the sealing material layer is easily formed thinly while its mechanical strength is increased.

Sixthly, in the method of producing a hermetic package according to the embodiment of the present invention, the sealing material to be used comprises 55 vol % to 95 vol % of bismuth-based glass and 5 vol % to 45 vol % of a refractory filler. The bismuth-based glass has good reactivity to ceramic as compared to glasses based on other materials. With this, the bonding strength between the ceramic base and the sealing material layer can be increased. Further, the bismuth-based glass has high thermal stability (devitrification resistance) while having a low melting point. With this, the sealing material layer softens and flows successfully at the time of laser sealing, and thus the accuracy of the laser sealing can be improved. The term "bismuth-based glass" refers to glass comprising $Bi_2O_3$ as a main component, and specifically refers to glass comprising 50 mass % or more of $Bi_2O_3$ in a glass composition.

Seventhly, in the method of producing a hermetic package according to the embodiment of the present invention, the sealing material layer preferably has an average thickness of less than 10 μm.

Eighthly, in the method of producing a hermetic package according to the embodiment of the present invention, the ceramic base and the sealing material layer preferably have a difference in thermal expansion coefficient of less than $45 \times 10^{-7}$/° C., and the sealing material layer and the glass substrate preferably have a difference in thermal expansion coefficient of less than $45 \times 10^{-7}$/° C. With this, a stress remaining in the sealed sites is decreased, which facilitates the prevention of stress fracture in the sealed sites.

Ninthly, in the method of producing a hermetic package according to the embodiment of the present invention, the ceramic base is preferably produced by sintering a green sheet laminate. With this, the ceramic base comprising the frame part is produced easily.

Tenthly, a hermetic package according to one embodiment of the present invention is preferably produced by the above-mentioned method of producing a hermetic package.

DESCRIPTION OF EMBODIMENTS

Figure 1:
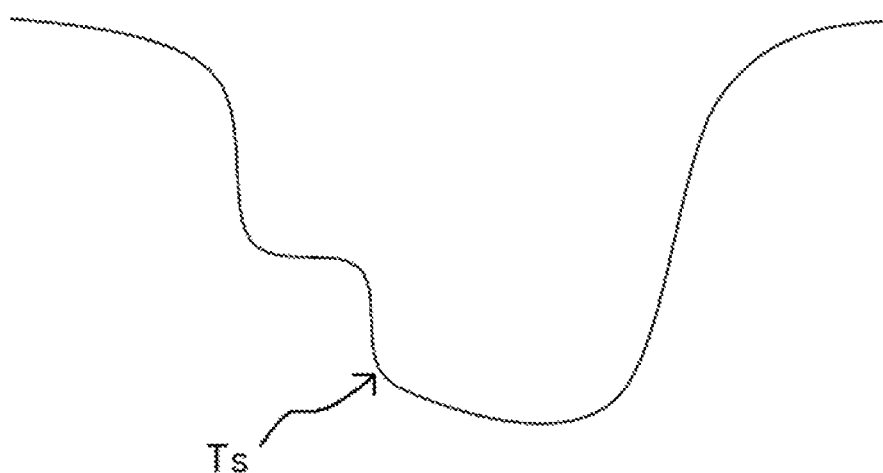
FIG. 1 is a schematic view for illustrating a softening point of a sealing material measured with a macro-type DTA apparatus.

A method of producing a hermetic package of the present invention comprises a step of preparing a ceramic base and forming a sealing material layer on the ceramic base. As a method of forming the sealing material layer on the ceramic base, the following method is preferred: a method involving applying a sealing material paste onto the ceramic base to form a sealing material film, and then drying the sealing material film to volatilize a solvent, and further firing the resultant at a temperature higher than the softening point of a sealing material to burn a resin component in the sealing material paste (binder removal treatment) and sinter (bond) the sealing material. With this, the sealing material layer can be formed easily, and bonding strength between the ceramic base and the sealing material layer can be increased.

As the ceramic base, alumina, aluminum nitride, zirconia, mullite, and the like are preferred from the viewpoints of material cost and sintering strength. In addition, as the ceramic base, also glass ceramic (hereinafter referred to as "LTCC") obtained by sintering a green sheet laminate is preferred. Alumina is advantageous in terms of material cost. Aluminum nitride is advantageous in terms of heat releasing property. LTCC is advantageous in that a ceramic base comprising a frame part is produced easily.

The thickness of the ceramic base is preferably from 0.1 mm to 1.0 mm. With this, the thickness of the hermetic package can be reduced.

In addition, as the ceramic base, it is preferred to use a ceramic base comprising a base part and a frame part formed on the base part and form the sealing material layer on a top of the frame part. With this, a member such as a piezoelectric vibrator element is easily housed in a hermetic package.

In this case, the top of the frame part is preferably subjected to polishing treatment. In this case, the top of the frame part has a surface roughness Ra of preferably less than 0.5 μm or 0.2 μm or less, particularly preferably from 0.01 μm to 0.15 μm, and has a surface roughness RMS of preferably less than 1.0 μm or 0.5 μm or less, particularly preferably from 0.05 μm to 0.3 μm. With this, the surface smoothness of the sealing material layer is improved, and the accuracy of the laser sealing can be improved. As a result, the sealing strength of the hermetic package can be increased. The "surface roughness Ra" and "surface roughness RMS" may be measured with, for example, a contact-type or noncontact-type laser film thickness meter, or a surface roughness meter.

It is preferred that the sealing material paste be applied onto the ceramic base along a peripheral end edge region thereof in a frame shape. With this, an effective area for functioning as a device can be enlarged. In addition, the member such as a piezoelectric vibrator element is easily housed in the hermetic package.

When the ceramic base comprises the frame part, it is preferred to form the frame part on the ceramic base along a peripheral end edge region thereof in a frame shape and apply the sealing material paste onto the top of the frame part. With this, the effective area for functioning as a device can be enlarged. In addition, the member such as a piezoelectric vibrator element is easily housed inside the frame part.

The sealing material past is generally produced by kneading the sealing material and a vehicle with a triple roller or the like. The vehicle generally comprises a resin and a solvent. As the resin to be used in the vehicle, there may be used, for example, an acrylate (acrylic resin), ethyl cellulose, a polyethylene glycol derivative, nitrocellulose, polymethylstyrene, polyethylene carbonate, polypropylene carbonate, or a methacrylate. As the solvent to be used in the vehicle, there may be used, for example, N,N'-dimethylformamide (DMF), α-terpineol, a higher alcohol, γ-butyllactone (γ-BL), tetralin, butyl carbitol acetate, ethyl acetate, isoamyl acetate, diethylene glycol monoethyl ether, diethylene glycol monoethyl ether acetate, benzyl alcohol, toluene, 3-methoxy-3-methylbutanol, triethylene glycol monomethyl ether, triethylene glycol dimethyl ether, dipropylene glycol monomethyl ether, dipropylene glycol monobutyl ether, tripropylene glycol monomethyl ether, tripropylene glycol monobutyl ether, propylene carbonate, dimethyl sulfoxide (DMSO), or N-methyl-2-pyrrolidone.

Various materials may be used as the sealing material, and for example, composite powder of glass powder and refractory filler powder may be used. Various materials may be used as the glass powder, and for example, bismuth-based glass, tin phosphate-based glass, vanadium-based glass, and the like may be used. From the viewpoints of thermal stability and depth of a reaction layer, bismuth-based glass is preferred. The term "tin phosphate-based glass" refers to glass comprising SnO and $P_2O_5$ as a main component, and specifically refers to glass comprising 40 mass % or more of SnO and $P_2O_5$ in total in a glass composition. The term "vanadium-based glass" refers to glass comprising $V_2O_5$ as a main component, and specifically refers to glass comprising 25 mass % or more of $V_2O_5$ in a glass composition.

In particular, as the sealing material, it is preferred to use a sealing material comprising 55 vol % to 95 vol % of bismuth-based glass and 5 vol % to 45 vol % of a refractory filler. It is more preferred to use a sealing material comprising 60 vol % to 85 vol % of bismuth-based glass and 15 vol % to 40 vol % of a refractory filler. It is particularly preferred to use a sealing material comprising 60 vol % to 80 vol % of bismuth-based glass and 20 vol % to 40 vol % of a refractory filler. When the refractory filler is added to the bismuth-based glass, the thermal expansion coefficient of the sealing material easily matches the thermal expansion coefficients of the ceramic base and the glass substrate. As a result, a situation in which an improper stress remains in the sealed sites after the laser sealing is prevented easily. Meanwhile, when the content of the refractory filler powder is too large, the content of the bismuth-based glass is relatively reduced. Thus, the surface smoothness of the sealing material layer is decreased, and the accuracy of the laser sealing is liable to be decreased.

It is desired that the bismuth-based glass comprise as a glass composition 0.5 mass % or more (preferably 2 mass % to 18 mass %, more preferably 3 mass % to 15 mass %, still more preferably 4 mass % to 12 mass %, particularly preferably 5 mass % to 10 mass %) of a transition metal oxide. With this, light absorption properties can be improved while a decrease in thermal stability is prevented.

The bismuth-based glass preferably comprises as a glass composition, in terms of mass %, 67% to 90% of $Bi_2O_3$, 2% to 12% of $B_2O_3$, 1% to 20% of ZnO, and 0.5% to 18% of $CuO+Fe_2O_3$. The reasons why the contents of the components are restricted as described above are described below. In the descriptions of the ranges of the contents of the components, the expression "%" represents "mass %". In addition, the content of "$CuO+Fe_2O_3$" refers to the total content of CuO and $Fe_2O_3$.

$Bi_2O_3$ is a main component for forming the reaction layer, and is also a main component for lowering the softening point. The content thereof is preferably from 67% to 87%, more preferably from 70% to 85%, particularly preferably from 72% to 83%. When the content of $Bi_2O_3$ is less than 67%, it becomes difficult to form the reaction layer. Besides, the softening point becomes too high, and hence the glass is difficult to soften even through irradiation with laser light. Meanwhile, when the content of $Bi_2O_3$ is more than 90%, the glass becomes thermally unstable, and hence the glass is liable to devitrify at the time of melting, sintering (bonding), or laser sealing.

$B_2O_3$ is a component that forms a glass network of bismuth-based glass. The content thereof is preferably from 2% to 12%, more preferably from 3% to 10%, still more preferably from 4% to 10%, particularly preferably from 5% to 9%. When the content of $B_2O_3$ is less than 2%, the glass becomes thermally unstable, and hence the glass is liable to devitrify at the time of melting, sintering (bonding), or laser sealing. Meanwhile, when the content of $B_2O_3$ is more than 12%, the softening point becomes too high, and hence the glass is difficult to soften even through irradiation with laser light.

ZnO is a component that suppresses the devitrification at the time of melting, sintering (bonding), or laser sealing and lowers the thermal expansion coefficient. The content thereof is preferably from 1% to 20%, more preferably from 2% to 15%, still more preferably from 3% to 11%, particularly preferably from 3% to 9%. When the content of ZnO is less than 1%, the above-mentioned effects are hardly obtained. Meanwhile, when the content of ZnO is more than 20%, the balance of the components in the glass composition is impaired, and the glass is liable to devitrify contrarily.

$CuO+Fe_2O_3$ is a component that has light absorption properties, and is also a component that, when glass is irradiated with laser light having a predetermined center emission wavelength, absorbs the laser light and is likely to soften the glass. In addition, $CuO+Fe_2O_3$ is a component that suppresses the devitrification at the time of melting, sintering (bonding), or laser sealing. The content of $CuO+Fe_2O_3$ is preferably from 0.5% to 18%, more preferably from 3% to 15%, still more preferably from 3.5% to 15%, even still more preferably from 4% to 12%, particularly preferably from 5% to 10%. When the content of $CuO+Fe_2O_3$ is less than 0.5%, the light absorption properties are degraded, and hence the glass is difficult to soften even through irradiation with laser light. Meanwhile, when the content of $CuO+Fe_2O_3$ is more than 18%, the balance of the components in the glass composition is impaired, and the glass is liable to devitrify contrarily. The content of CuO is preferably from 0% to 15%, from 1% to 15%, from 2% to 12%, or from 3% to 10%, particularly preferably from 4.5% to 10%. The content of $Fe_2O_3$ is preferably from 0% to 7%, from 0.05% to 7%, or from 0.1% to 4%, particularly preferably from 0.2% to 3%.

An Fe ion in iron oxide is present under a state of $Fe^{2+}$ or $Fe^{3+}$. In the present invention, the Fe ion in the iron oxide is not limited to any one of $Fe^{2+}$ and $Fe^{3+}$ and may be $Fe^{2+}$ or $Fe^{3+}$. Thus, in the present invention, even in the case of $Fe^{2+}$, the content of the iron oxide is expressed on the basis of a value obtained by conversion to $Fe_2O_3$. Particularly when infrared laser light is used as irradiation light, the ratio of $Fe^{2+}$ is preferably larger because $Fe^{2+}$ has an absorption peak in the infrared region. For example, the ratio of $Fe^{2+}/Fe^{3+}$ in the iron oxide is preferably restricted to 0.03 or more (desirably 0.08 or more).

The following components may be added in addition to the above-mentioned components.

$SiO_2$ is a component that enhances water resistance. The content of $SiO_2$ is preferably from 0% to 10%, from 0% to 3%, particularly preferably from 0% to less than 1%. When the content of $SiO_2$ is more than 10%, the softening point becomes too high, and hence the glass is difficult to soften even through irradiation with laser light.

$Al_2O_3$ is a component that enhances the water resistance. The content of $Al_2O_3$ is preferably from 0% to 5% or from 0% to 2%, particularly preferably from 0% to less than 0.5%. When the content of $Al_2O_3$ is more than 5%, the softening point becomes too high, and hence the glass is difficult to soften even through irradiation with laser light.

MgO+CaO+SrO+BaO (the total content of MgO, CaO, SrO, and BaO) is a component that suppresses the devitrification at the time of melting, sintering (bonding), or laser sealing. The content of MgO+CaO+SrO+BaO is preferably from 0% to 15%, particularly preferably from 0% to 10%. When the content of MgO+CaO+SrO+BaO is more than 15%, the softening point becomes too high, and hence the glass is difficult to soften even through irradiation with laser light. The contents of MgO, CaO, and SrO are each preferably from 0% to 5%, particularly preferably from 0% to 2%. The content of BaO is preferably from 0% to 10%, particularly preferably from 0% to 8%.

$CeO_2$, $WO_3$, $In_2O_3$, $Ga_2O_3$, and $Sb_2O_3$ are components that suppress the devitrification at the time of melting, sintering (bonding), or laser sealing. The content of each of the components is preferably from 0% to 10%, from 0% to 5%, or from 0% to 2%, particularly preferably from 0% to 1%. When the content of each of the components is more than 10%, the balance of the components in the glass composition is impaired, and the glass is liable to devitrify contrarily. From the viewpoint of enhancing the thermal stability, $Sb_2O_3$ is preferably added in a trace amount, and specifically, $Sb_2O_3$ is preferably added at 0.05% or more.

Oxides of Li, Na, K, and Cs are components that lower the softening point, but have an action of accelerating the devitrification at the time of melting. Thus, the total content of the oxides is preferably restricted to less than 1%.

$P_2O_5$ is a component that suppresses the devitrification at the time of melting. However, when the content of $P_2O_5$ is more than 1%, the glass is liable to undergo phase separation at the time of melting.

$La_2O_3$, $Y_2O_3$, and $Gd_2O_3$ are components that suppress the phase separation at the time of melting. However, when the total content thereof is more than 3%, the softening point becomes too high, and hence the glass is difficult to soften even through irradiation with laser light.

NiO, $V_2O_5$, CoO, $MoO_3$, $TiO_2$, and $MnO_2$ are components that have light absorption properties, and are also components that, when glass is irradiated with laser light having a predetermined center emission wavelength, absorb the laser light and are likely to soften the glass. The content of each of the components is preferably from 0% to 7%, particularly preferably from 0% to 3%. When the content of each of the components is more than 7%, the glass is liable to devitrify at the time of laser sealing.

PbO is a component that lowers the softening point but is a component that may adversely affect the environment. Thus, the content of PbO is preferably less than 0.1%.

Other components than those described above may be added at, for example, up to 5% as long as the glass characteristics are not impaired.

As the refractory filler, one kind or two or more kinds selected from cordierite, zircon, tin oxide, niobium oxide, zirconium phosphate-based ceramic, and willemite are preferably used. Those refractory fillers each have a low thermal expansion coefficient and a high mechanical strength, and besides are each well compatible with the bismuth-based glass. Among the refractory fillers described above, cordierite is most preferred. Cordierite has a property of causing the bismuth-based glass to less devitrify at the time of laser sealing while having a small particle diameter. Other than the refractory fillers described above, β-eucryptite, quartz glass, or the like may be added.

It is preferred that the refractory filler powder (particularly, cordierite) be doped with 0.1 mass % to 5 mass % (preferably 1 mass % to 3 mass %) of a transition metal oxide, such as CuO or $Fe_2O_3$. With this, light absorption properties are imparted to the refractory filler powder, and hence the light absorption properties of the sealing material can be improved.

The average particle diameter $D_{50}$ of the refractory filler is preferably less than 2 μm, particularly preferably less than 1.5 μm. When the average particle diameter $D_{50}$ of the refractory filler is less than 2 μm, the surface smoothness of the sealing material layer is improved, and the average thickness of the sealing material layer is easily controlled to less than 10 μm. As a result, the accuracy of the laser sealing can be improved.

The maximum particle diameter $D_{99}$ of the refractory filler is preferably less than 5 μm or 4 μm or less, particularly preferably 3 μm or less. When the maximum particle diameter $D_{99}$ of the refractory filler is less than 5 μm, the surface smoothness of the sealing material layer is improved, and the average thickness of the sealing material layer is easily controlled to less than 10 μm. As a result, the accuracy of the laser sealing can be improved. Herein, the terms "average particle diameter $D_{50}$" and "maximum particle diameter $D_{99}$" each refer to a value measured by laser diffractometry on a volume basis.

The thermal expansion coefficient of the sealing material is preferably from $60 \times 10^{-7}/°$ C. to $95 \times 10^{-7}/°$ C. or from $60 \times 10^{-7}/°$ C. to $85 \times 10^{-7}/°$ C., particularly preferably from $65 \times 10^{-7}/°$ C. to $80 \times 10^{-7}/°$ C. With this, the thermal expansion coefficient of the sealing material layer matches the thermal expansion coefficients of the glass substrate and the ceramic base, and hence a stress remaining in the sealed sites is reduced. In addition, the content of the refractory filler can be reduced, and hence the sealing material layer easily softens and flows at the time of laser sealing. The thermal expansion coefficient refers to a value measured with a push-rod-type TMA apparatus within a temperature range of from 30° C. to 300° C.

A difference in thermal expansion coefficient between the ceramic base and the sealing material layer is preferably less than $45 \times 10^{-7}/°$ C., particularly preferably $30 \times 10^{-7}/°$ C. or less, and a difference in thermal expansion coefficient between the sealing material layer and the glass substrate is preferably less than $45 \times 10^{-7}/°$ C., particularly preferably $30 \times 10^{-7}/°$ C. or less. When the differences in thermal expansion coefficient are too large, a stress remaining in the sealed sites becomes improperly large, and there is a risk in that the long-term reliability of the hermetic package is decreased.

The softening point of the sealing material is preferably 500° C. or less or 480° C. or less, particularly preferably 450° C. or less. When the softening point is higher than 500° C., it becomes difficult to achieve the surface smoothness at the time of sintering (bonding) the sealing material. Further, it becomes difficult to cause the sealing material to soften and flow at the time of laser sealing. The lower limit of the softening point is not particularly set. However, in consideration of the thermal stability of the glass, the softening point is preferably 350° C. or more. Herein, the term "softening point" refers to the fourth inflection point measured with a macro-type DTA apparatus, and corresponds to Ts in FIG. 1.

The sealing material may further comprise a laser absorber in order to improve the light absorption properties, but the laser absorber has an action of accelerating the devitrification of the bismuth-based glass. Therefore, the content of the laser absorber is preferably from 0 vol % to 15 vol % or from 0 vol % to 12 vol %, particularly preferably from 0 vol % to 10 vol %. When the content of the laser absorber is more than 15 vol %, the glass is liable to devitrify at the time of laser sealing. As the laser absorber, a Cu-based oxide, an Fe-based oxide, a Cr-based oxide, a Mn-based oxide, or a spinel-type composite oxide thereof may be used. In particular, from the viewpoint of compatibility with the bismuth-based glass, a Mn-based oxide is preferred. When the laser absorber is added, the content thereof is preferably 0.1 vol % or more, 0.5 vol % or more, 1 vol % or more, or 1.5 vol % or more, particularly preferably 2 vol % or more.

The sealing material layer may be formed after mounting a member on the ceramic base, but is preferably formed before mounting the member (in particular, an element susceptible to thermal degradation) on the ceramic base from the viewpoint of preventing the thermal degradation of the member.

The average thickness of the sealing material layer after its formation on the ceramic base is controlled to preferably less than 10 μm or less than 7 μm, particularly preferably less than 5 μm. Similarly, also the average thickness of the sealing material layer after the laser sealing is controlled to preferably less than 10 μm or less than 7 μm, particularly preferably less than 5 μm. As the average thickness of the sealing material layer becomes smaller, a stress remaining in the sealed sites after the laser sealing is reduced more even when the thermal expansion coefficients of the sealing material layer, the ceramic base, and the glass substrate do not match sufficiently. In addition, also the accuracy of the laser sealing can be improved. As a method of controlling the average thickness of the sealing material layer as described above, the following methods are given: a method involving applying the sealing material paste thinly; and a method involving subjecting the surface of the sealing material layer to polishing treatment after the formation of the sealing material layer.

The surface roughness Ra of the sealing material layer after its formation on the ceramic base is controlled to preferably less than 0.5 μm or 0.2 μm or less, particularly preferably from 0.01 μm to 0.15 μm. In addition, the surface roughness RMS of the sealing material layer after its formation on the ceramic base is controlled to preferably less than 1.0 μm or 0.5 μm or less, particularly preferably from 0.5 μm to 0.3 μm. With this, adhesiveness between the glass substrate and the sealing material layer is increased, and the accuracy of the laser sealing is improved. As a method of controlling the surface roughness Ra and RMS of the sealing material layer as described above, the following methods are given: a method involving subjecting the top of the frame part of the ceramic base to polishing treatment; a method involving controlling the particle size of the refractory filler powder; and a method involving subjecting the surface of the sealing material layer to polishing treatment.

The method of producing a hermetic package of the present invention comprises a step of preparing a glass substrate and arranging the ceramic base and the glass substrate so that the glass substrate is brought into contact with the sealing material layer on the ceramic base. Various glasses may be used as the glass substrate. For example, alkali-free glass, borosilicate glass, or soda lime glass may be used. In particular, from the viewpoint of weather resistance, alkali-free glass is preferred.

The thickness of the glass substrate is preferably from 0.01 mm to 2.0 mm or from 0.1 mm to 1 mm, particularly preferably from 0.5 mm to 0.7 mm. With this, the thickness of the hermetic package can be reduced.

The glass substrate may be arranged below the ceramic base, but from the viewpoint of efficiency of the laser sealing, is preferably arranged above the ceramic base.

The method of producing a hermetic package of the present invention comprises a step of irradiating the sealing material layer with laser light from a glass substrate side to seal the ceramic base and the glass substrate with each other through intermediation of the sealing material layer, to thereby provide a hermetic package.

Various lasers may be used as the laser. In particular, a semiconductor laser, a YAG laser, a $CO_2$ laser, an excimer laser, an infrared laser, and the like are particularly preferred because those lasers are easy to handle.

An atmosphere for performing the laser sealing is not particularly limited. An air atmosphere or an inert atmosphere, such nitrogen atmosphere, may be adopted.

At the time of laser sealing, when the glass substrate is preheated at a temperature higher than or equal to 100° C. and lower than and equal to the strain point of the glass substrate, cracks in the glass substrate owing to thermal shock can be suppressed. In addition, when an annealing laser is radiated from the glass substrate side immediately after the laser sealing, the cracks in the glass substrate owing to thermal shock can be suppressed.

Embodiments of the hermetic package of the present invention are described below with reference to the drawings.

Figure 2:
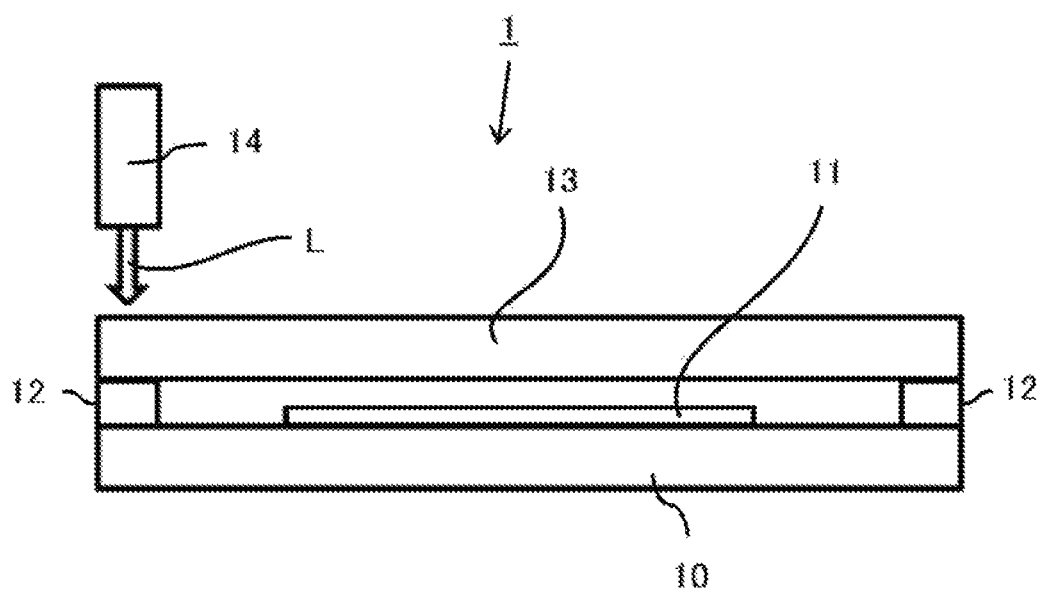
FIG. 2 is a conceptual sectional view for illustrating one embodiment of a hermetic package of the present invention.

FIG. 2 is a conceptual sectional view for illustrating one embodiment of the hermetic package of the present invention. In a hermetic package 1, a member 11 (piezoelectric vibrator element) is formed in a center region of a rectangular ceramic base 10, and a sealing material layer 12 is formed on a peripheral end edge region of the ceramic base 10 so as to surround the member 11 in a frame shape. In this case, the sealing material layer 12 is formed by applying the sealing material paste, and drying the paste, followed by sintering. An electrode film (not shown) configured to electrically connect the member 11 to an outside is formed on the ceramic base 10. In addition, a glass substrate 13 is arranged above the ceramic base 10 so as to be brought into contact with the sealing material layer 12. Further, laser light L output from a laser irradiation apparatus 14 is radiated from a glass substrate 13 side along the sealing material layer 12. With this, the sealing material layer 12 softens and flows to seal the ceramic base 10 and the glass substrate 13 with each other, and thus a hermetic structure of the hermetic package 1 is formed.

Figure 3:
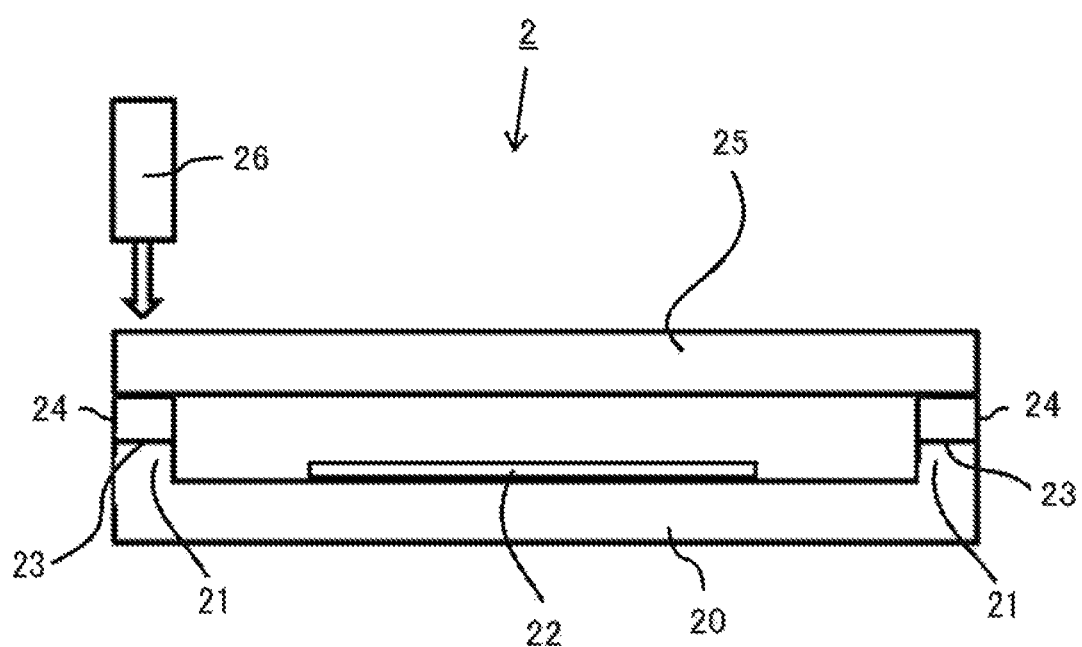
FIG. 3 is a conceptual sectional view for illustrating another embodiment of the hermetic package of the present invention.

FIG. 3 is a conceptual sectional view for illustrating another embodiment of the hermetic package of the present invention. In a hermetic package 2, a rectangular ceramic base 20 comprises a frame part 21 in its peripheral end edge region, and a member 22 (a resin having dispersed therein quantum dots) is housed inside the frame part 21. In addition, a sealing material layer 24 is formed on a top 23 of the frame part 21. In this case, the ceramic base 20 is produced by sintering a green sheet laminate. In addition, the top 23 of the frame part 21 is subjected to polishing treatment in advance, and has a surface roughness Ra of 0.15 µm or less. Further, the sealing material layer 24 is formed by applying the sealing material paste, and drying the paste, followed by sintering. An electrode film (not shown) configured to electrically connect the member 22 to an outside is formed on the ceramic base 20. A glass substrate 25 is arranged above the ceramic base 20 so as to be brought into contact with the sealing material layer 24. Further, laser light L output from a laser irradiation apparatus 26 is radiated from a glass substrate 25 side along the sealing material layer 24. With this, the sealing material layer 24 softens and flows to seal the ceramic base 20 and the grass substrate 24 with each other, and thus a hermetic structure of the hermetic package 2 is formed.

EXAMPLES

Now, the present invention is described in detail by way of Examples. The following Examples are merely illustrative. The present invention is by no means limited to the following Examples.

First, a sealing material was produced. The material composition of the sealing material is shown in Table 1. The bismuth-based glass comprises as a glass composition, in terms of mol %, 76.5% of $Bi_2O_3$, 8.0% of $B_2O_3$, 6.0% of ZnO, 5.0% of CuO, 0.5% of $Fe_2O_3$, and 4.0% of BaO, and has particle sizes shown in Table 1.

TABLE 1

| | | |
|---|---|---|
| Bismuth-based glass (vol %) | | 72 |
| Refractory filler (vol %) | | 28 |
| Bismuth-based glass particle size (µm) | $D_{50}$ | 1.0 |
| | $D_{99}$ | 3.2 |
| Refractory filler particle size (µm) | $D_{50}$ | 1.0 |
| | $D_{99}$ | 2.8 |
| Glass transition point (° C.) | | 380 |
| Softening point (° C.) | | 450 |
| Thermal expansion coefficient [30-300° C.] ($\times 10^{-7}$/° C.) | | 78 |

The above-mentioned bismuth-based glass and refractory filler powder were mixed at a ratio shown in Table 1 to produce a sealing material. As a refractory filler, cordierite having particle sizes shown in Table 1 was used. The sealing material was measured for a glass transition point, a softening point, and a thermal expansion coefficient. The results are shown in Table 1.

The glass transition point refers to a value measured with a push-rod-type TMA apparatus.

The softening point refers to a value measured with a macro-type DTA apparatus. The measurement was performed under an air atmosphere in the range of from room temperature to 600° C. at a temperature increase rate of 10° C./min.

The thermal expansion coefficient refers to a value measured with a push-rod-type TMA apparatus. The range of measurement temperatures is from 30° C. to 300° C.

Next, a sealing material layer was formed on a ceramic base by using the sealing material described above (Sample Nos. 1 to 6). First, the sealing material shown in Table 1, a vehicle, and a solvent were kneaded so as to achieve a viscosity of about 100 Pa·s (25° C., shear rate: 4), and then further kneaded with a triple roll mill until powders were homogeneously dispersed, to thereby provide a paste. A vehicle prepared by dissolving an ethyl cellulose resin in a glycol ether-based solvent was used as the vehicle. Next, the resultant sealing material paste was printed in a frame shape with a screen printing machine so as to achieve a thickness of about 5 µm or about 8 µm and a width of about 0.3 mm on a ceramic base (alumina or LTCC) measuring 3 mm in length×3 mm in width×0.8 mm in thickness along its peripheral end edge region. Further, the sealing material paste was dried at 120° C. for 10 minutes under an air atmosphere, followed by firing at 500° C. for 10 minutes under an air atmosphere, to burn a resin component in the sealing material paste (binder removal treatment) and sinter (bond) the sealing material. Thus, a sealing material layer was formed on the ceramic base. After that, an element was formed on a center region of the ceramic base. As Comparative Examples, the sealing material layer was formed on a glass substrate under the same firing conditions (Sample Nos. 7 to 9).

The average thickness of the sealing material layer refers to a value measured with a noncontact-type laser film thickness meter.

Finally, under an air atmosphere, the ceramic base and a glass substrate were arranged so as to be brought into contact with each other through intermediation of the sealing material layer. After that, the resultant was irradiated with laser light having a wavelength of 808 nm at an output and a scanning speed shown in Tables 2 and 3 from a glass substrate side along the sealing material layer to cause the sealing material layer to soften and flow, to thereby seal the ceramic base and the glass substrate with each other. Thus, hermetic packages shown in Tables 2 and 3 were obtained.

TABLE 2

| | No. 1 | No. 2 | No. 3 | No. 4 | No. 5 | No. 6 |
|---|---|---|---|---|---|---|
| Glass substrate | Alkali-free glass | Alkali-free glass | Alkali borosilicate glass | Alkali-free glass | Alkali-free glass | Alkali borosilicate glass |
| Ceramic base Sealing material layer Forming side | Alumina Ceramic base | Alumina Ceramic base | Alumina Ceramic base | LTCC Ceramic base | LTCC Ceramic base | LTCC Ceramic base |
| Sealing material layer Average thickness (µm) | 5 | 8 | 5 | 5 | 8 | 5 |
| Laser light Output (W) | 17 | 14 | 11 | 17 | 14 | 10 |
| Scanning speed (mm/s) | 11 | 11 | 8 | 13 | 13 | 8 |
| Detachability (HAST) | ◯ | ◯ | ◯ | ◯ | ◯ | ◯ |

TABLE 3

|  | No. 7 | No. 8 | No. 9 |
|---|---|---|---|
| Glass substrate | Alkali-free glass | Alkali-free glass | Alkali borosilicate glass |
| Ceramic base | Alumina | LTCC | Alumina |
| Sealing material layer Forming side | Glass substrate | Glass substrate | Glass substrate |
| Sealing material layer Average thickness (μm) | 5 | 5 | 8 |
| Laser light Output (W) | 17 | 17 | 14 |
| Scanning speed (mm/s) | 11 | 13 | 11 |
| Detachability (HAST) | x | x | x |

The samples were each subjected to a pressure cooker test (highly accelerated temperature and humidity stress test: HAST test). After that, the presence or absence of detachment between the ceramic base and the glass substrate was observed, and detachability was evaluated as follows: the case in which no detachment was observed was evaluated as "o"; and the case in which detachment was observed was evaluated as "x". The conditions of the HAST test are 121° C., a humidity of 100%, 2 atm, and 24 hours.

As is apparent from Tables 2 and 3, the evaluation of detachability was good in Sample Nos. 1 to 6 because the sealing material layer was formed on a ceramic base side, followed by laser sealing. Those results mean that the sealing material layer and the ceramic base were subjected to laser sealing under a state of having a high bonding strength. Meanwhile, the evaluation of detachability was poor in Sample Nos. 7 to 9 because the sealing material layer was formed on a glass substrate side, followed by laser sealing. Those results mean that the sealing material layer and the ceramic base did not react with each other sufficiently because softening and flowing of the sealing material layer through the laser sealing was performed in a short time period, and hence a high bonding strength was not obtained.

INDUSTRIAL APPLICABILITY

The hermetic package of the present invention is suitably applicable to a piezoelectric vibrator package. Other than the above, the hermetic package of the present invention is also suitably applicable to a hermetic package configured to house a light-emitting diode, a hermetic package configured to house a resin or the like having dispersed therein low-heat-resistant quantum dots, and the like.

REFERENCE SIGNS LIST 1, 2 hermetic package
10, 20 ceramic base
11, 22 member
12, 24 sealing material layer
13, 25 glass substrate
14, 26 laser irradiation apparatus
21 frame part
23 top of frame part
L laser light

The invention claimed is:

1. A method of producing a hermetic package, the method comprising the steps of:
    preparing a ceramic base and forming a sealing material layer on the ceramic base;
    preparing a glass substrate and arranging the ceramic base and the glass substrate so that the glass substrate is brought into contact with the sealing material layer on the ceramic base; and
    irradiating the sealing material layer with laser light from a glass substrate side to seal the ceramic base and the glass substrate with each other through intermediation of the sealing material layer, to thereby provide a hermetic package,
    wherein the ceramic base comprises a base part and a frame part formed on the base part and the sealing material layer is formed on a top of the frame part, and
    wherein the forming a sealing material layer is performed by applying and firing a sealing material paste to form a sealing material layer formed of a sintered body of a sealing material on the ceramic base.

2. The method of producing a hermetic package according to claim 1, wherein the sealing material layer is formed on the ceramic base after subjecting the top of the frame part to polishing treatment.

3. The method of producing a hermetic package according to claim 2, wherein the top of the frame part has a surface roughness Ra of less than 0.5 μm after the polishing treatment.

4. The method of producing a hermetic package according to claim 1, wherein the sealing material to be used comprises 55 vol % to 95 vol % of bismuth-based glass and 5 vol % to 45 vol % of a refractory filler.

5. The method of producing a hermetic package according to claim 1, wherein the sealing material layer has an average thickness of less than 10 μm.

6. The method of producing a hermetic package according to claim 1, wherein the ceramic base and the sealing material layer have a difference in thermal expansion coefficient of less than $45\times10^{-7}/°$ C., and the sealing material layer and the glass substrate have a difference in thermal expansion coefficient of less than $45\times10^{-7}/°$ C.

7. The method of producing a hermetic package according to claim 1, further comprising producing the ceramic base by sintering a green sheet laminate.

* * * * *